United States Patent [19]

Glover et al.

[11] Patent Number: 4,665,365

[45] Date of Patent: May 12, 1987

[54] METHOD FOR REVERSING RESIDUAL TRANSVERSE MAGNETIZATION DUE TO PHASE-ENCODING MAGNETIC FIELD GRADIENTS

[75] Inventors: Gary H. Glover, Waukesha; Norbert J. Pelc, Wauwatosa, both of Wis.

[73] Assignee: General Electric Company, Milwaukee, Wis.

[21] Appl. No.: 689,428

[22] Filed: Jan. 7, 1985

[51] Int. Cl.$^4$ .............................................. G01R 33/20
[52] U.S. Cl. ...................................... 324/309; 324/307
[58] Field of Search ................ 324/300, 307, 309, 313, 324/314, 318, 322, 311

[56] References Cited

U.S. PATENT DOCUMENTS

| | | | |
|---|---|---|---|
| 4,484,138 | 11/1984 | Bottomley et al. | 324/307 |
| 4,520,315 | 5/1985 | Loeffler et al. | 324/309 |
| 4,532,474 | 7/1985 | Edelstein | 324/309 |
| 4,602,641 | 7/1986 | Feinberg | 324/309 X |
| 4,609,872 | 9/1986 | O'Donnell | 324/309 X |

Primary Examiner—Stewart J. Levy
Assistant Examiner—Scott M. Oldham
Attorney, Agent, or Firm—Douglas E. Stoner

[57] ABSTRACT

A method for reversing residual transverse magnetization due to spatial encoding magnetic field gradient pulses, used in magnetic resonance imaging to encode spatial information, employs a reversing gradient pulse applied in the same direction as the encoding gradient pulse following the observation of the spin-echo signal. The encoding gradient pulse is applied following the 180° RF pulse to avoid the effects of imperfections associated therewith. In one embodiment, the amplitudes of the encoding and reversing gradient pulses are selected to be approximately the negatives of each other so as to substantially cancel the residual magnetization. In another embodiment, the amplitude of the reversing gradient pulse is selected such that the algebraic sum thereof with the corresponding amplitude of the encoding gradient pulse is a constant. In this case, the residual magnetization is not necessarily cancelled, but rather, is left in the same state after each view of the pulse sequence. The method is applicable to multiple-echo and driven equilibrium pulse sequences.

10 Claims, 8 Drawing Figures

METHOD FOR REVERSING RESIDUAL TRANSVERSE MAGNETIZATION DUE TO PHASE-ENCODING MAGNETIC FIELD GRADIENTS

BACKGROUND OF THE INVENTION

This invention relates to magnetic resonance (MR) methods. More specifically, this invention relates to methods useful with MR imaging techniques to undo the effects on the residual transverse magnetization due to magnetic field gradient pulses used to encode spatial information thereinto.

By way of background, the nuclear magnetic resonance phenomenon occurs in atomic nuclei having an odd number of protons or neutrons. Due to the spin of the protons and the neutrons, each such nucleus exhibits a magnetic moment, such that, when a sample composed of such nuclei is placed in a static, homogeneous magnetic field, $B_o$, a greater number of nuclear magnetic moments align with the field than against the field to produce a net macroscopic magnetization M (also referred to as longitudinal magnetization) in the direction of the field. If perturbed from this preferred alignment, under the influence of the magnetic field $B_o$, magnetization M precesses about the axis of the field at a frequency which is dependent on the strength of the applied magnetic field and on the characteristics of the nuclei. The angular precession frequency, $\omega$, also referred to as the Larmor frequency, is given by the Larmor equation $\omega = \gamma B$, in which $\gamma$ is the gryomagnetic ratio which is constant for each MR isotope and wherein B is the magnetic field acting upon the nuclear spins. It will be thus apparent that the resonant frequency is dependent on the strength of the magnetic field in which the sample is positioned.

The orientation of magnetization M, in equilibrium directed along the magnetic field $B_o$, may be perturbed by the application of a magnetic field oscillating at the Larmor frequency. Typically, such a magnetic field, designated $B_1$, is applied in a direction orthogonal to the direction of the static magnetic field by means of a radio frequency (RF) pulse through RF coils connected to a radio-frequency-transmitting apparatus. The effect of field $B_1$ is to rotate magnetization M about the direction of the $B_1$ field. This may be best visualized if the motion of magnetization M due to the application of the RF pulses is considered in a Cartesian coordinate system which rotates at a frequency substantially equal to the resonant frequency about the main magnetic field $B_o$ in the same direction in which the magnetization M precesses (i.e., the rotating frame). In this case, the $B_o$ field is typically chosen to be directed in the positive direction of the Z-axis, which, in the rotating frame, is designated Z' to distinguish it from the fixed-coordinate system. Similarly, the X- and Y-axes of the rotating frame are designated X' and Y'. Bearing this in mind, the effect of an RF pulse, then, is to rotate magnetization M, for example, from its direction along the positive Z' axis toward the transverse plane defined by the X' and Y' axes. An RF pulse having sufficient magnitude and duration to rotate magnetization M into the transverse plane (i.e., 90° from the direction of the $B_o$ field) is conveniently referred to as a 90° RF pulse. Similarly, proper selection of magnitude and duration of an RF pulse will cause magnetization M to change direction from the positive Z' axis to the negative Z' axis. This kind of an RF pulse is referred to as a 180° RF pulse, or for obvious reasons, as an inverting pulse. It should be noted that a 90° or a 180° RF pulse will rotate magnetization M through the corresponding number of degrees from any initial direction of magnetization M. It should be further noted that an MR signal will only be observed if magnetization M has a net transverse component (perpendicular to $B_o$) in the transverse plane. Assuming an initial orientation of magnetization M in the direction of the $B_o$ field, a 90° RF pulse produces maximum net transverse magnetization in the transverse plane since all of magnetization M is in that plane, while a perfect 180° RF pulse does not produce any transverse magnetization. As will be discussed hereinafter, in practice, perfect 180° RF pulses are difficult to achieve in all regions of the object lying within the field of an RF coil so that magnetization M is rotated by either more or less than 180°. This can adversely affect image quality.

RF pulses may be selective or nonselective. Selective pulses are typically modulated to have a predetermined frequency content so as to excite nuclear spins situated in preselected regions of the sample having precession frequencies as predicted by the Larmor equation. The selective pulses are applied in the presence of localizing magnetic field gradients (discussed hereinbelow). Nonselective pulses generally affect all of the nuclear spins situated within the field of the RF pulse transmitter coil and are typically applied in the absence of localizing magnetic field gradients.

Upon cessation of the RF excitation, magnetization M due to the excited nuclear spins begins to return to equilibrium under the influence of the $B_o$ field. Any transverse component of the magnetization M will rotate about the Z-axis. As it does so, the magnetic flux intercepts the conductors of the RF coil and induces therein a voltage, termed the free induction decay (FID) MR signal. As is well known, 180° RF pulses can be used to refocus the nuclear spins, following an FID, to produce spin-echo signals which are useful in MR investigational techniques. For many materials the return to equilibirum is governed by two exponential time constants associated with longitudinal and transverse magnetizations. The time constants characterize the rate of return to equilibrium of these magnetization components following the application of perturbing RF pulses. The first time constant is referred to as the spin-lattice relaxation time ($T_1$) and is the constant for return of the longitudinal magnetization to return to its equilibrium value. Spin-spin relaxation time ($T_2$) is the constant for the transverse magnetization to return to its equilibrium value of zero in a perfectly homogeneous field $B_o$. In fields having inhomogeneities, the time constant for transverse magnetization is governed by a constant denoted $T_2^*$, with $T_2^*$ being less than $T_2$.

There remains to be considered the use of magnetic field gradients to encode spatial information (used to reconstruct images, for example) into MR signals. Typically, three such gradients are necessary:

$G_x(t) = \partial B_o / \partial x,$ $G_y(t) = \partial B_o / \partial y,$ and $G_z(t) = \partial B_o / \partial z.$ The $G_x$, $G_y$, and $G_z$ gradients are positionally constant throughout the imaging slice, but their magnitudes are typically time dependent. The magnetic fields associated with the gradients are denoted, respectively, $b_x$, $b_y$, and $b_z$, wherein $$b_x = G_x(t)x,$$

$$b_y = G_y(t)y,$$

$$b_z = G_z(t)z,$$

within the volume.

In the recent past, MR has been developed into an imaging modality utilized to obtain images of anatomical features of human patients, for example. Such images depicting nuclear spin distribution (typically protons associated with water in tissue), $T_1$ and/or $T_2$ relaxation parameters are believed to be of medical diagnostic value in determining the state of health of examined tissue. Imaging data for constructing MR images can be collected using one of many available techniques. Typically, such techniques comprise a pulse sequence made up of a plurality of sequentially implemented views. Each view includes at least an RF excitation pulse and a magnetic field gradient pulse to encode spatial information into the MR signal.

One known MR imaging technique which is particularly useful is of the Fourier transform (FT) type, a variant of which is frequently referred to as "spin warp." The spin-warp tecnique is discussed in an article entitled "Spin Warp NMR Imaging and Applications to Human Whole Body Imaging" by W.A. Adelstein et al, *Physics in Medicine and Biology*, Vol. 25, pp. 751–756 (1980). Briefly, the spin-warp technique, which will be discussed in greater detail hereinafter, employs a variable amplitude phase-encoding magnetic field gradient pulse prior to the acquisition of spin-echo signals to phase-encode spatial information in the direction of this gradient. In a two-dimensional implementation, spartial information is encoded in a direction orthogonal to the phase-encoding axis by observing the spin-echo signal in the presence of a magnetic field gradient in a direction orthogonal to that of the phase-encoding gradient. In a typical pulse sequence, the magnitude of the phase-encoding gradient pulse is incremented monotonically in the temporal sequence of views.

In some embodiments of FT MR pulse sequences, it is desirable to undo (reverse) the phase encoding accomplished in one view prior to applying phase-encoding gradient pulse in a temporally adjacent subsequent view. One case where this is useful is when the phase-encoding amplitude order is not monotonic. Other than monotonic order may be used, for example, to reduce periodic motion ghost artifacts, as disclosed and claimed in U.S. patent application Ser. No. 683,071 assigned to the same assignee as the present invention and which is incorporated herein by reference. It has been found that when a view employing a large amplitude phase-encoding gradient pulse follows a view in which a small amplitude phase-encoding gradient pulse is used, residual transverse magnetization resulting from the small phase-encoding pulse can corrupt the measurement in the large phase-encoding view. This can have a deleterious effect on image quality. The effects of residual magnetization will be discussed next in greater detail.

In any imaging pulse sequence, a dynamic equilibrium is set up governed by $T_1$ and $T_2$ relaxation relative to pulse sequence repetition time TR. Thus, if $TR < 2T_2$, some transverse magnetization from the preceding view will still be present when the new view is to begin. This magnetization will retain the phasing given it in the preceding view. In particular, if the last phase-encoding gradient magnitude were small, the residual isochromats will be little dephased. During the new view sequence, a component of this residual magnetization will rephase along with the newly generated magnetization. The resulting spin echo will consist, then, of the two components. If the current phase-encoding gradient is of high magnitude, the "new" spin-echo component can be small enough that the left over component (from a large amplitude previous spin echo) may be comparable, or even dominant, when this happens, the data acquired for the new view is corrupted.

In the normal sequential advancement of phase encoding, the residual component is always much smaller that the new (primary) component because the difference in the primary component from one view of the next is slight, and relaxation effects thus deplete the left over magnetization component.

In non-sequential advancement, a large preceding component, even when depleted by relaxation, can be significant relative to the signal for a large phase encoding.

It is, therefore, a principal object of the invention to provide a method for reversing the effects on the residual transverse magnetization due to gradient pulses employed in each view of an MR pulse sequence, such that the magnetization is left in the same state after each view, i.e., with no memory of the particular gradient amplitude employed).

SUMMARY OF THE INVENTION

A method is provided for reversing the effects on the residual transverse magnetization in a pulse sequence of the type useful for producing images of a sample object positioned in a homogeneous magnetic field. The pulse sequence includes a predetermined plurality of sequentially implemented views. Each view includes at least one RF excitation pulse for exciting nuclear spins in the study object, one 180° RF pulse for generating a spin-echo signal and one magnetic field gradient pulse applied along at least one directional axis of the object for encoding information into the spin-echo signal. The magnetic field gradient pulse is applied subsequent to the irradiation of the object with the 180° RF pulse, but prior to the occurrence of the spin-echo signal. An additional field gradient pulse, referred to herein as the reversing pulse, is applied following the occurrence of the spin-echo signal. The additional pulse is applied substantially in the same direction as the initial gradient pulse. The amplitude of the initial and reversing gradient pulse in each view are selected such that the algebraic sum thereof is equal to a constant.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
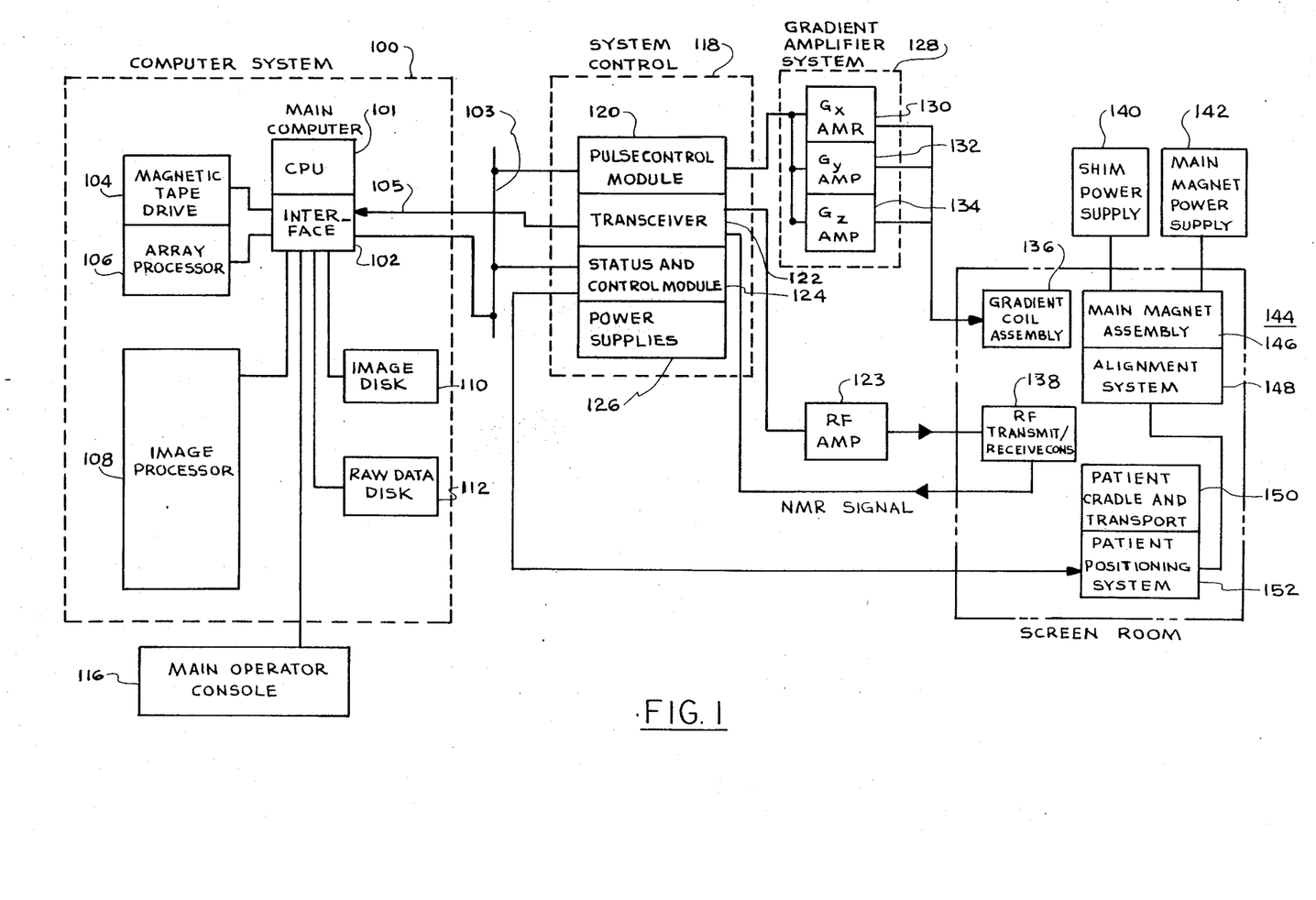
FIG. 1 is a block circuit schematic of an exemplary MR system.

Referring first to FIG. 1, there is shown in block diagram form the major components of an exemplary MR system. It should be understood, however, that this is an exemplary embodiment of the apparatus and that in fact the invention is not apparatus dependent. The overall operation of the system is under the control of a host computer system generally designated 100 which includes a main computer 101 (such as a Data General MV4000). The computer has associated therewith an interface 102 through which a plurality of computer peripheral devices and other MR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for pre-processing data and data reconstruction. The function of image processor 108 is to provide interactive image display manipulation such as magnification, image comparison, and gray scale adjustment. The computer system is provided with a means to store raw (unreconstructed) image data utilizing a disc data storage system designated 12. An operator console 116 is also coupled to the computer by means of interface 102 and provides the operator with the means to input data pertinent to a patient stud as well as additional data necessary for proper MR system operation, such as initiating and terminating scans. The operator console may also be used to display images stored on discs or magnetic tape.

The computer system exercises control over the MR system by means of control and gradient amplifier systems generally designated 118 and 128, respectively. The computer communicates with system control 118 by means of a digital communication network 103 (such as the Ethernet network) in a manner well known to those skilled in the art. The system control includes several subsystems such as the pulse control module (PCM) 120, a radio frequency transceiver 122, a status and control module (SCM) 124, and the power supplied generally designated 126 necessary to energize the components. The PCM utilizes control signals provided by computer 101 to generate digital timing and control signals such as the current waveforms used for gradient coil excitation, as well as RF envelope waveforms utilized in the transceiver for modulating RF pulses. The gradient waveforms are applied to the gradient amplifier system 128 generally comprised of $G_x$, $G_y$, and $G_z$ and amplifiers 130, 132, and 134, respectively, each utilized to excite a corresponding gradient coil in an assembly generally designated 136 and which is part of a magnet assembly 146. When energized, the gradient coils generate substantially linear, mutually orthogonal magnetic field gradients $G_x$, $G_y$, and $G_z$ directed in the X-, Y-, and Z-axis directions of a Cartesian coordinate system. The point of intersection defined by the planes containing each of the gradients is termed an "isocenter" and normally is situated substantially at the center of the static magnetic field volume. The reconstructed images are typically centered at the isocenter.

The gradient magnetic fields are utilized in combination with radio frequency pulses generated by transceiver 122 to encode spatial information into the MR signals emanating from the region of the patient being studied. Waveforms and control signals provided by the pulse control module are utilized by transceiver subsystem 122 for RF carrier modulation and control of the operating mode; that is, the transmit or receive mode. In the transmit mode, the transmitter provides a radio frequency carrier waveform modulated in accordance with the control signals to an RF power amplifier 123 which then energizes RF coils 138 which are situated within main magnet assembly 146. The MR signals radiated by the excited nuclei are sensed by the same or a different RF coil than is used for transmitting. The signals are detected, amplified, demodulated, filtered, and digitized in the receiver section of the transceiver. The processed signals are transmitted to the main computer for processing by means of a dedicated, unidirectional, high-speed digital link 105 which links interface 102 and transceiver 122.

The PCM and SCM are independent subsystems both of which communicate with main computer 101, peripheral systems, such as patient positioning system 152, as well as to one another by means of link 103. The PCM and SCM are each comprised of a 16-bit microprocessor (such as an Intel 8086) for processing commands from the main computer. The SCM includes means for acquiring information regarding patient cradle (not shown) position and position of the moveable patient alignment light fan beam (not shown). This information is used by the main computer to modify image display and reconstruction parameters. The SCM also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the power supply is utilized to bring the magnet to the proper operating field and then is disconnected. In the case of a permanent magnet, power supply 142 would not be needed. The patient alignment system 148 operates in combination with a patient cradle and transport system 150 and patient positioning system 152. To minimize interference from external sources, the MR system components comprised of the main magnet assembly, the gradient coil assembly, and the RF transmit and receiver coils, as well as the associated power supplies and patient-handling devices, are enclosed in an RF-shielded room generally designated 144. The shielding is generally provided by a copper or aluminum screen network which encloses the entire room. The screen network serves to contain the RF signals generated by the system, while shielding the system from RF signals generated outside the room. A bidirectional attenuation of approximately 100 db. is typical in the frequency range of operation.

Although the present invention can be employed with both Fourier transform and projection reconstruction imaging methods, it will be disclosed in more detail with reference to the FT method.

Figure 2:
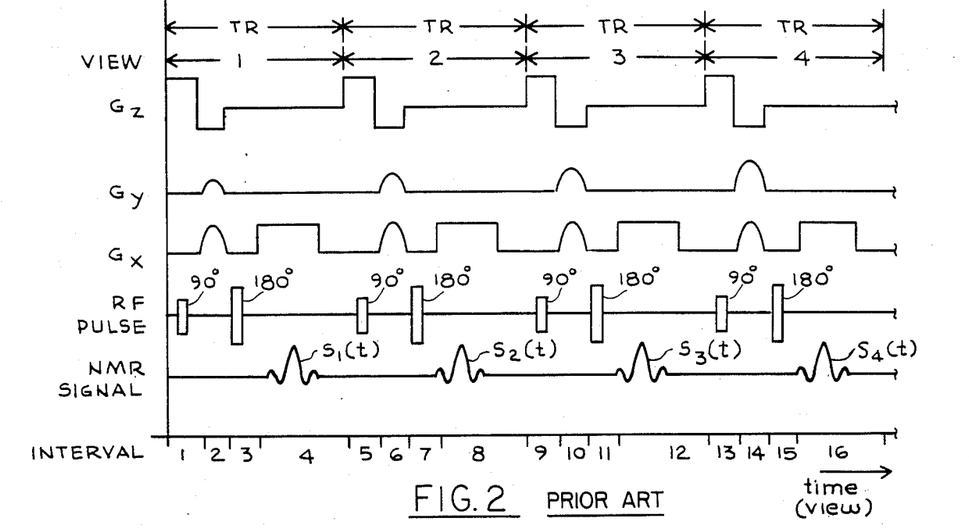
FIG. 2 depicts four views of a conventional spin-warp imaging pulse sequence.

One exemplary pulse sequence useful in acquiring multiple spin echo image data is shown in FIG. 2 which depicts four views of a two-dimensional Fourier transform (2DFT) MR imaging technique commonly referred to as spin warp. The views comprise intervals 1–4, 5–8, 9–12, and 13–16, as indicated along the horizontal axis. A complete pulse sequence (scan) would typically consist of a 128, 256, or 512 views which are substantially identical to one another with the exception that a different amplitude of the phase encoding magnetic field gradient pulse $G_y$, as indicated along the vertical axis, is employed in each view (assuming no averaging). It will be understood that the various pulses comprising the pulse sequence are generated by the MR system described hereinbefore.

One exemplary view comprising intervals 1–4 will now be described in detail with reference to FIG. 2. In interval 1, a selective, 90° RF excitation pulse is applied in the presence of a positive $G_z$ gradient pulse so as to preferentially excite nuclear spins in a predetermined region of a sample object (not shown) having precession frequencies as predicted by the Larmor equation that are within the bandwidth of the RF pulse. A negative $G_z$ pulse is applied in interval 2 to rephase nuclear spins excited in interval 1. Typically, the $G_z$ gradient pulses are selected such that the time integral of the gradient pulse waveform over interval 2 is approximately equal to a negative one half of the time integral of the gradient pulse waveform over interval 1. $G_x$ and $G_y$ magnetic field gradient pulses are applied simultaneously with the $G_z$ gradient pulse in interval 2. The function of the $G_y$ gradient is as alluded to hereinabove, to encode phase information into the excited nuclear spins. The purpose of the $G_x$ pulse is to dephase the excited nuclear spins by a predetermined amount to delay the occurrence of the MR spin echo signal in interval 4. The spin echo signal is produced by the application of a 180° inverting pulse in interval 3. The spin echo signal is sampled in interval 4 in the presence of a $G_x$ readout gradient which encodes spatial information along the x-axis into the frequency of the received signal. The MR information encoded in the MR signal by the phase encoding and the readout gradients is recovered in a well-known manner using two-dimensional Fourier transform techniques.

The excitation/sampling process, as described hereinabove, is repeated in each view of the pulse sequence until the $G_y$ gradient is sequenced, typically monotonically, through its range of amplitudes. In this manner, in the course of a complete scan spin-echo signals are observed in each view thereby providing sufficient data to construct an image of the region examined. The repetition time TR is the period of time between the beginning of a pulse sequence of one view and the beginning of a succeeding (essentially identical, except for the amplitude of the $G_y$ phase encoding gradient) pulse sequence of the next view. As depicted in FIG. 2, TR is measured between the mean application of 90°0 RF pulses in succeeding views. Typically, TR is not varied in the course of a single scan, but can be varied from one scan to the next. In a pulse sequence utilizing a single spin echo signal such as that occurring in interval 4, TR typically is selected to be sufficiently long to allow magnetization to return to equilibrium prior to the next excitation RF pulse.

As alluded to hereinabove, in some FT pulse sequences where the temporal order of phase-encoding views is not monotonic, measurements taken in a view using a large amplitude phase-encoding gradient pulse, which follows a view employing a low magnitude phase-encoding pulse, can be degraded by residual transverse magnetization from the view with the low amplitude gradient pulse. This problem is particularly severe if the repetition time TR is not long enough to allow the nuclear spins to realign with the polarizing magnetic field and thereby "forget" the previous NMR experiment.

Figure 3:
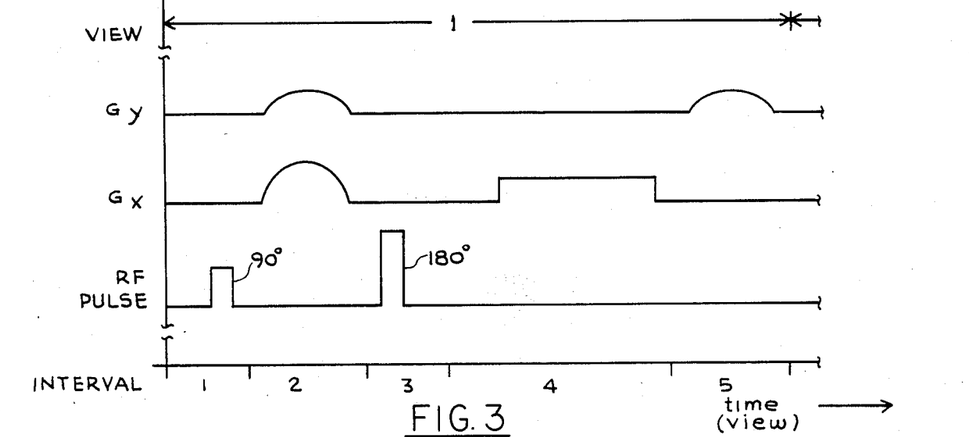
FIG. 3 depicts portions of a single view of a spin-warp sequence with respect to which the inventive method may be best appreciated.

One method which has been considered for reducing the effects of residual transverse magnetization is depicted in FIG. 3. FIG. 3 depicts one view of a pulse sequence similar to that described with reference to FIG. 2, with the exception that the $G_z$ gradient and the NMR signal are not shown to preserve figure clarity. A notable difference between the views of FIGS. 2 and 3 is that in interval 5 of FIG. 3, a $G_y$ gradient pulse is applied to undo the effects of the phase-encoding $G_y$ gradient pulse applied in interval 2 on the residual magnetization. The amplitude of the reversing pulse in interval 5 is selected to be equal to that of the pulse in interval 2.

This technique, however, has been found not to work as well as expected to eliminate the effects of residual magnetization. It has been determined that this is due to imperfections in the 180° RF pulse applied in interval 3. The RF pulse imperfections which are of particular importance are those which occur in the phase-encoding direction. That is, some of the nuclear spins are rotated by amounts greater than or less than 180°. Thus, unless the 180° pulse is perfect, the reversing gradient pulse in interval 5 will not cancel the residual magnetization effects due to the pulse in interval 2.

Figure 4:
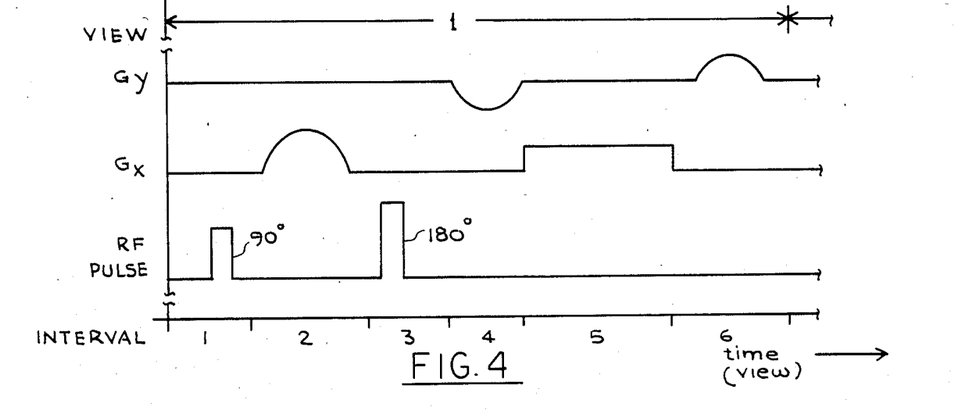
FIG. 4 depicts portions of a single view of a spin-warp pulse sequence embodying one embodiment of the inventive method.

One embodiment of the method in accordance with the invention is depicted in FIG. 4, which depicts one view of a pulse sequence similar to that of FIG. 2. In the inventive method, the deleterious effect of imperfect 180° RF pulses is avoided by delaying the application of the phase-encoding $G_y$ gradient pulse until after the application of the 180° RF pulse in interval 3. Thus, the $G_y$ phase-encoding gradient pulse is applied in interval 4. Delaying the application of the phase-encoding pulse may increase the minimum echo delay time. However, the rephasing $G_y$ pulse in interval 6 is highly effective in reversing the residual magnetization effects due to the $G_y$ pulse in interval 4. The result is that, regardless of the amplitude of the $G_y$ phase-encoding gradient pulse in interval 4, the magnetization is left in the same state following each view.

In the example shown in FIG. 4, the reversing and phase-encoding gradient amplitudes are chosen so as to return the residual transverse magnetization to the state it would be in if no phase-encoding gradient had been used at all. In some applications, all that is required is that the residual transverse magnetization be left in the same state that is independent of the particular phase-encoding gradient amplitude used for that view. To do this, the sum of the amplitude of the phase-encoding gradient and the amplitude of the reversing gradient should be equal to a constant. In the example shown in FIG. 4, the constant has been chosen to be equal to zero. In any case, as the amplitude of the phase-encoding gradient varies, so does the amplitude of the reversing gradient.

The application of the inventive method to a multiple spin-echo pulse sequence will be described next with reference to FIG. 5 which depicts one examplary view. In this pulse sequence, 180° RF pulses are applied in intervals 2 and 6 so that resulting spin-echo signals occur and are observed in intervals 4 and 8, respectively, in the presence of $G_x$ readout gradient pulses. Phase-encoding pulses are applied in intervals 3 and 7, subsequent to the application of the 180° RF pulses in intervals 2 and 6. The $G_y$ pulses to reverse residual magnetization due to phase-encoding pulses are applied in intervals 5 and 9. The phase-encoding pulse in interval 7 is needed because the reversing pulse in interval 5 cancels the phase encoding imparted by the pulse in interval 3, as intended.

Figure 5:
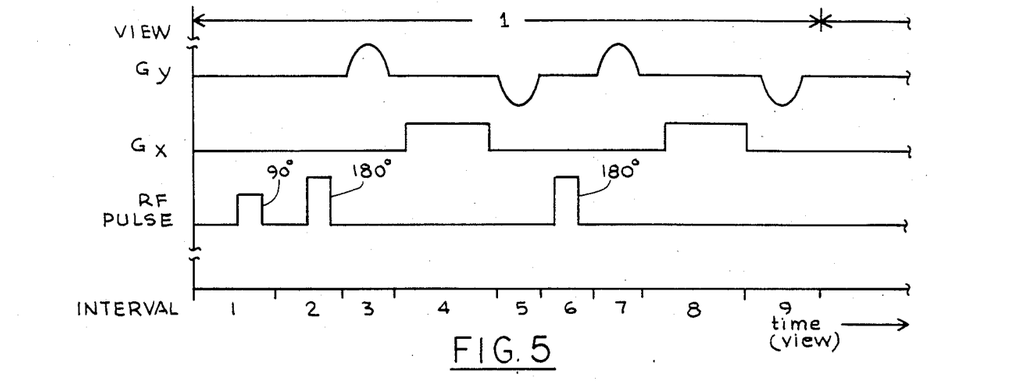
FIG. 5 depicts portions of a single view of a multi-echo spin-warp sequence in accordance with another embodiment of the inventive method.
Figure 6:
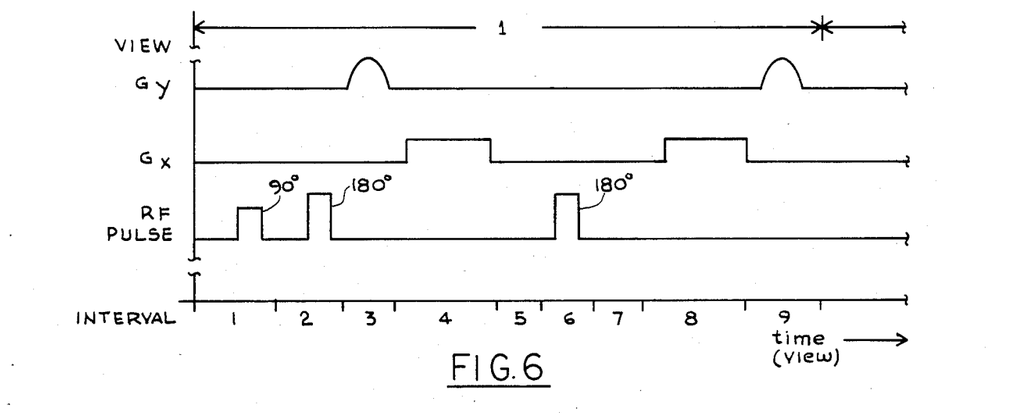
FIG. 6 is similar to FIG. 5 and depicts a simplified embodiment of the inventive method applicable to multi-echo pulse sequences.
Figure 6A:
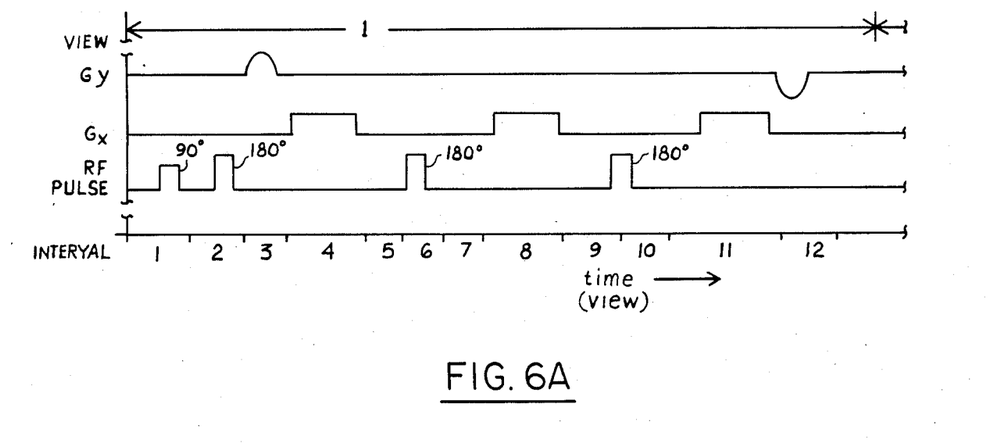
FIG. 6A depicts an embodiment of the inventive method, applicable to pulse sequences with an odd number of 180° RF pulses.

The method described with reference to FIG. 5 is effective to cancel the residual magnetization following the application of each 180° RF pulse. In some cases, such degree of correction is not needed so that the pulse sequence of FIG. 5 can be simplified. The manner in which this is accomplished is depicted in FIG. 6 which is substantially identical to FIG. 5, with the exception that the reversing and phase-encoding gradient pulses in intervals 5 and 7, respectively, of FIG. 5 are omitted. Reversal of the residual magnetization is accomplished by a single pulse applied in interval 9 of FIG. 6. The sign of the reversing gradient pulse in interval 9 of FIG. 6 is changed from that of FIG. 5, since the reversing gradient and the phase-encoding gradient are on opposite sides of the 180° RF pulse in interval 6.

Figure 7:
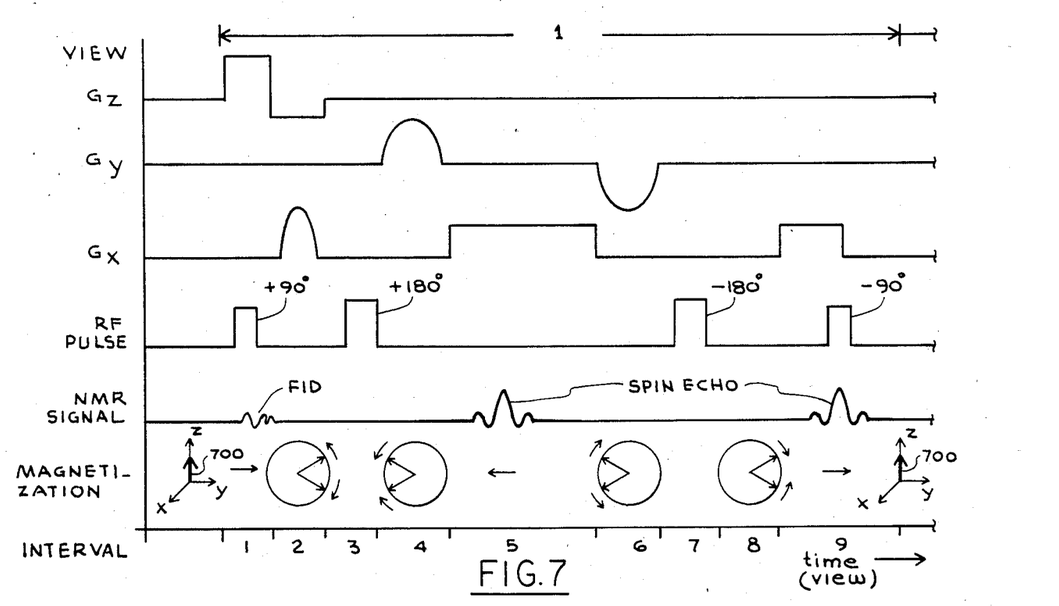
FIG. 7 depicts one view of a spin-warp pulse sequence employing driven equilibrium techniques and embodying the method of the invention.

FIG. 7 depicts one exemplary view of a driven equilibrium imaging pulse sequence to which the method of the invention is also applicable. The application of the driven equilibrium method to MR imaging is disclosed and claimed in commonly assigned U.S. patent application Ser. No. 530,810, now U.S. Pat. No. 4,532,474, filed Sept. 9, 1983 by W. A. Edelstein and which is incorporated herein by reference. Referring now to the exemplary view of the pulse sequence depicted in FIG. 5, it will be seen that a $G_y$ phase-encoding pulse is applied in interval 4 subsequent to the application of a 180° RF pulse in interval 3. The reversing $G_y$ gradient pulse is applied in interval 6. In accordance with the driven equilibrium method, a $-180°$ RF pulse and a $-90°$ RF pulse are applied in intervals 7 and 9, respectively. The $-90°$ RF pulse is applied, as is known, at the time of occurrence of the maxima in the spin-echo signal produced by the $-180°$ RF pulse. The purpose of the $-180°$ and $-90°$ RF pulses is to drive the magnetization to its equilibrium position at the end of interval 9 in alignment with the $B_o$ field, as suggested by arrow 700. This state of magnetization corresponds to that existing in interval 1 prior to the application of the 90° RF excitation pulse. The magnetization diagrams shown along the horizontal axis depict various magnetization states occurring at various times between RF excitation in interval 1 and return of magnetization to equilibrium at the end of interval 9.

In some applications, such as the correction of patient-motion artifacts, complete cancellation of the magnetization is not necessary. All that is needed is that the magnetization be left in the same state after each view. To this end, the amplitude of the reversing gradient pulse (e.g., interval 6, FIG. 4) is selected such that the algebraic sum thereof with the amplitude of the phase-encoding gradient pulse (e.g., interval 4, FIG. 4) is equal to a constant.

The preferred embodiments of the invention have been disclosed hereinbefore by way of example with reference to a 2DFT pulse sequence. It will be recognized by those skilled in the art that the invention could also be practiced with a three-dimensional embodiment of the sequence. In this case, variable amplitude $G_z$ phase-encoding gradient pulses would be applied in intervals 4 and 6 of FIG. 4 to encode spatial image information in the z-axis direction and to undo this encoding, respectively. A three-dimensional spin-warp pulse sequence is disclosed and claimed in U.S. Pat. No. 4,431,968, assigned to the same assignee as the present invention and which is incorporated herein by reference as background material.

Figure 8:
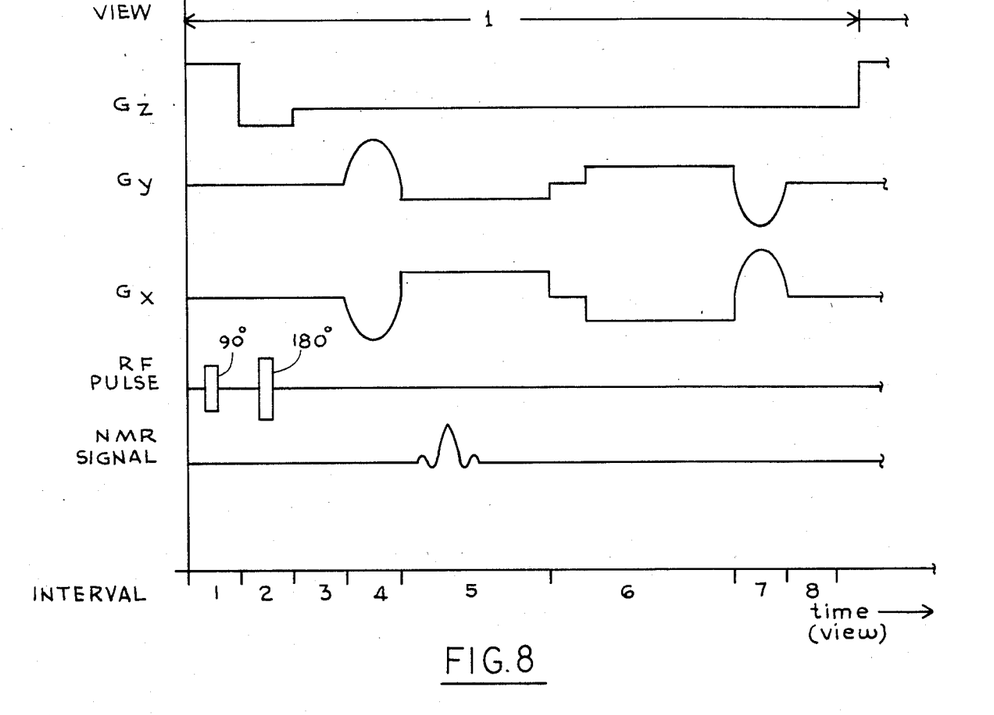
FIG. 8 depicts one exemplary view of a multiple-angle projection reconstruction pulse sequence employing one embodiment of the inventive method.

The application of the invention to multiple-angle projection reconstruction NMR imaging techniques will be briefly described next with reference to FIG. 8 which depicts one view of a two-dimensional pulse sequence. A selective 90° RF pulse is applied in interval 1 in the presence of a positive $G_z$ gradient pulse followed by a negative rephasing $G_z$ gradient pulse in interval 2. An inverting 180° RF pulse is applied in interval 3 to create a spin-echo signal in interval 5. Dephasing $G_x$ and $G_y$ gradient pulses are applied in interval 4 to time the occurrence of the spin-echo signal in interval 5. In a well-known manner, projection measurements are acquired in interval 5 by the application of constant $G_x$ and $G_y$ gradients which add vectorially to produce a resultant gradient, termed the readout gradient. The magnitude of the $G_x$ and $G_y$ gradients determine the projection angle $\theta$, (i.e., $\tan \theta = G_y/G_x$). In view 2, and subsequent views, the amplitudes of the $G_y$ and $G_x$ gradients are adjusted to change the orientation of the readout gradient to obtain projection data from at least a 180° arc within an imaging slice (not shown). An image is constructed from all of the projection measurements using known reconstruction techniques.

In the case of multiple-angle projection reconstruction, the area under the projection remains constant from view to view. This implies that the area under the modulus of the spin-echo signal remains constant, as well. The details of the temporal evolution of the spin-echo signal vary from view to view, however. Thus, if the view angle is not stepped sequentially, there can be abrupt discontinuities in the signal. As in the 2DFT imaging case, such discontinuities can cause image artifacts if the view repetition time is short enough that residual magnetization from a preceding view corrupts the current view. The effect can be reversed by the application in intervals 6 and 7 of FIG. 8 of $G_x$ and $G_y$ gradient pulses such that the time integrals of each of the $G_x$ and $G_y$ gradient waveforms taken over intervals 4–7 are equal to zero. The exact waveform of the $G_x$ and $G_y$ gradients in intervals 6 and 7 is not important, provided this condition is satisfied. In the particular embodiment of FIG. 8, the $G_x$ and $G_y$ waveforms in intervals 6 and 7 have been selected to have the same configurations but opposite polarities relative to pulses in intervals 5 and 4, respectively.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for undoing the effect of magnetic field gradients on the residual transverse magnetization in a pulse sequence useful for producing images of a study object positioned in a homogeneous magnetic field, which pulse sequence includes a predetermined plurality of sequentially implemented views, each of said views including at least one RF excitation pulse for exciting nuclear spins in the object, one 180° RF pulse for generating a spin-echo signal, and at least one encoding magnetic field gradient pulse used to encode spatial information into said spin-echo signal, said method comprising the steps of:

applying said encoding magnetic field gradient pulse subsequent to the irradiation of the study object with said 180° RF pulse, but prior to the occurrence of said spin-echo signal, said encoding magnetic field gradient pulse being applied along at least one directional axis of the study object; and applying, following the occurrence of said spin-echo signal, a reversing magnetic field gradient pulse so as to undo the effects of said encoding magnetic field gradient pulse on any residual transverse magnetization, the amplitude of said reversing and encoding gradient pulses being selected such that the algebraic sum thereof along said one axis is equal to a constant.

2. The method of claim 1 wherein the amplitude of the reversing magnetic gradient pulse is selected to be substantially equal to the negative amplitude of the encoding pulse.

3. The method of claim 1 wherein each view includes a plurality of 180° RF pulses and a corresponding plurality of spin-echo signals, said method further comprising the steps of applying an encoding magnetic gradient pulse before the occurrence of each of said spin-echo signals and a reversing magnetic field gradient pulse following the occurrence of each spin-echo signal, wherein the amplitudes of said encoding and reversing gradient pulses preceding and following each spin-echo signal in each view are selected such that the algebraic sum thereof is equal to a constant.

4. The method of claim 3 wherein the amplitude of the reversing magnetic gradient pulse is selected to be substantially equal to the negative amplitude of the encoding pulse.

5. The method of claim 1 wherein each view includes an odd plurality of 180° RF pulses and a corresponding plurality of spin-echo signals, said method further comprising the step of applying an encoding magnetic field gradient subsequent to the application of said first 180° RF pulse, but prior to the occurrence of the first spin-echo signal and applying a reversing magnetic field gradient pulse subsequent to the occurrence of the last spin-echo signal due to the application of the last one of said plurality of 180° RF pulses, the amplitudes of said encoding and reversing magnetic field gradient pulses in each view being selected such that the algebraic sums thereof are equal to a constant.

6. The method of claim 5 wherein the amplitudes of the encoding and reversing magnetic gradient pulses are selected to be substantially identical.

7. The method of claim 1 wherein each view includes an even plurality of 180° RF pulses and a corresponding plurality of spin-echo signals, said method further comprising the step of applying an encoding magnetic field gradient pulse subsequent to the application of said first 180° RF pulse, but prior to the occurrence of the first spin-echo signal and reapplying a reversing magnetic field gradient pulse subsequent to the occurrence of the last spin-echo signal due to the application of the last one of plurality of 180° RF pulses, wherein the algebraic sum of the amplitude of the encoding gradient and the negative amplitude of the reversing gradient in each view is equal to a constant.

8. The method of claim 7 wherein the amplitude of the encoding pulse and the negative amplitude of the reversing magnetic gradient pulse are selected to be substantially identical.

9. The method of claim 1 wherein said encoding gradient pulse comprises a phase-encoding gradient pulse.

10. The method of claim 1 wherein said pulse sequence comprises a multiple-angle projection reconstruction imaging method and wherein said encoding gradient pulse is a dephasing gradient which allows the spin echo to be detected in the presence of a read-out gradient.

* * * * *